United States Patent
Ogita et al.

(10) Patent No.: US 7,588,969 B2
(45) Date of Patent: Sep. 15, 2009

(54) METHOD FOR MANUFACTURING SEMICONDUCTOR DEVICE, AND SEMICONDUCTOR DEVICE

(75) Inventors: Kaori Ogita, Machida (JP); Tomoko Tamura, Atsugi (JP); Junya Maruyama, Ebina (JP); Koji Dairiki, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 210 days.

(21) Appl. No.: 11/417,182

(22) Filed: May 4, 2006

(65) Prior Publication Data
US 2006/0266410 A1 Nov. 30, 2006

(30) Foreign Application Priority Data
May 31, 2005 (JP) ............................. 2005-160730

(51) Int. Cl.
*H01L 21/00* (2006.01)

(52) U.S. Cl. ...................... 438/149; 438/458; 438/464; 438/768; 257/E21.601

(58) Field of Classification Search ................ 438/110, 438/149, 455, 458, 464, 479, 758, 768; 257/E21.601
See application file for complete search history.

(56) References Cited

U.S. PATENT DOCUMENTS

| 6,127,199 | A | 10/2000 | Inoue et al. |
| 6,174,564 | B1 * | 1/2001 | Scott et al. ............... 427/126.3 |
| 6,207,280 | B1 * | 3/2001 | Atarashi et al. ............. 428/403 |
| 6,372,608 | B1 | 4/2002 | Shimoda et al. |
| 6,454,964 | B1 * | 9/2002 | Scott et al. ............. 252/182.12 |
| 6,645,830 | B2 | 11/2003 | Shimoda et al. |
| RE38,466 | E | 3/2004 | Inoue et al. |
| 6,818,530 | B2 | 11/2004 | Shimoda et al. |
| 7,164,151 | B2 * | 1/2007 | Yamazaki et al. ............. 257/52 |
| 2003/0025118 | A1 | 2/2003 | Yamazaki et al. |
| 2003/0032210 | A1 | 2/2003 | Takayama et al. |
| 2003/0217805 | A1 | 11/2003 | Takayama et al. |
| 2004/0087110 | A1 | 5/2004 | Takayama et al. |
| 2004/0121602 | A1 | 6/2004 | Maruyama et al. |

(Continued)

FOREIGN PATENT DOCUMENTS

CN  1397984  2/2003

(Continued)

OTHER PUBLICATIONS

Office Action (Application No. 200610087709.5) Dated Apr. 3, 2009.

*Primary Examiner*—Charles D. Garber
*Assistant Examiner*—Stanetta D Isaac
(74) *Attorney, Agent, or Firm*—Eric J. Robinson; Robinson Intellectual Property Law Office, P.C.

(57) ABSTRACT

The present invention provides a manufacturing method of a thinned semiconductor device with high reliability at low cost and a semiconductor device manufactured by the method. A peeling layer, a transistor, and an insulating layer are formed in this order over a substrate, an opening is formed so as to expose at least a part of the peeling layer, and the transistor is peeled off from the substrate by a physical means. The peeling layer is formed by forming a metal film and a metal oxide film so as to be in contact with the metal film by a method using a solution.

50 Claims, 7 Drawing Sheets

U.S. PATENT DOCUMENTS

| | | |
|---|---|---|
| 2004/0129960 A1 | 7/2004 | Maruyama et al. |
| 2004/0132265 A1 | 7/2004 | Maruyama et al. |
| 2004/0219762 A1 | 11/2004 | Shimoda et al. |
| 2004/0256618 A1 | 12/2004 | Imai et al. |
| 2004/0265253 A1* | 12/2004 | Seo et al. .................. 424/63 |
| 2005/0051870 A1 | 3/2005 | Yamazaki et al. |
| 2005/0056842 A1 | 3/2005 | Nishi et al. |
| 2005/0090075 A1 | 4/2005 | Takayama et al. |
| 2006/0030122 A1 | 2/2006 | Shimoda et al. |
| 2007/0054436 A1 | 3/2007 | Hirakata et al. |

FOREIGN PATENT DOCUMENTS

| | | |
|---|---|---|
| CN | 1516288 | 7/2004 |
| EP | 1 435 653 | 7/2004 |
| JP | 10-125931 | 5/1998 |
| WO | WO 2005/041249 | 5/2005 |

\* cited by examiner

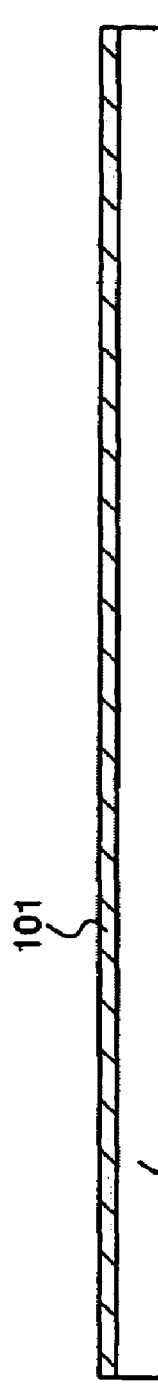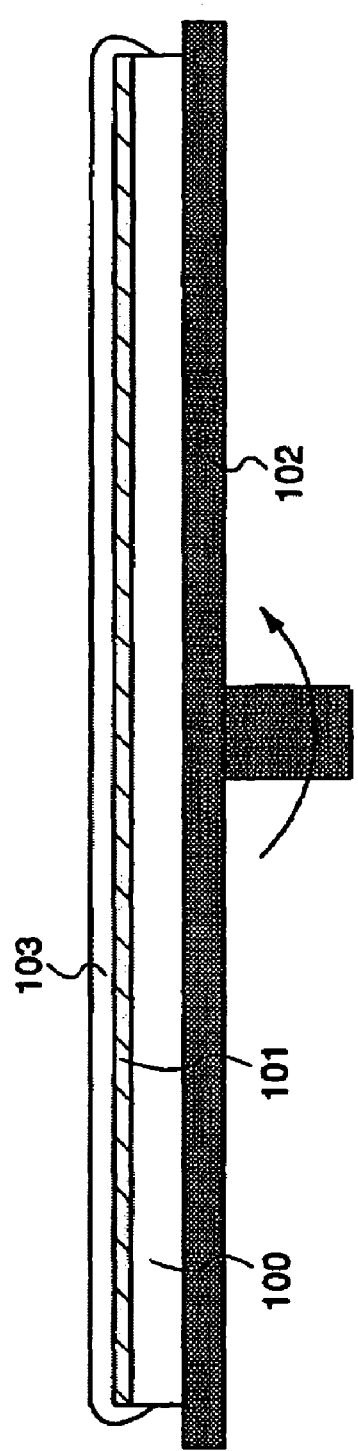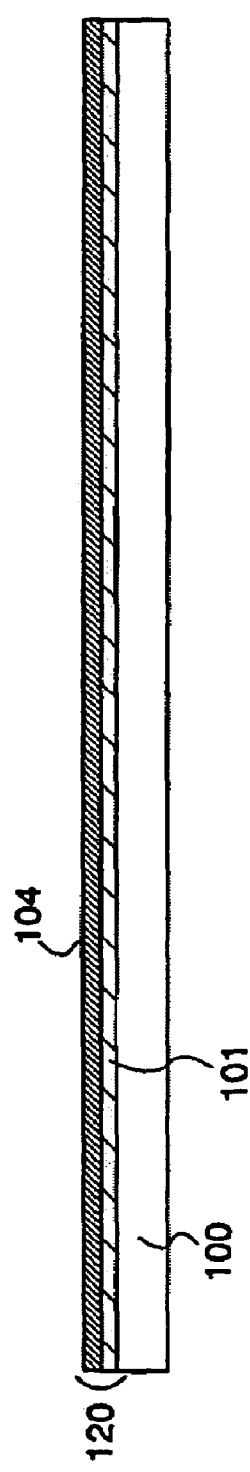

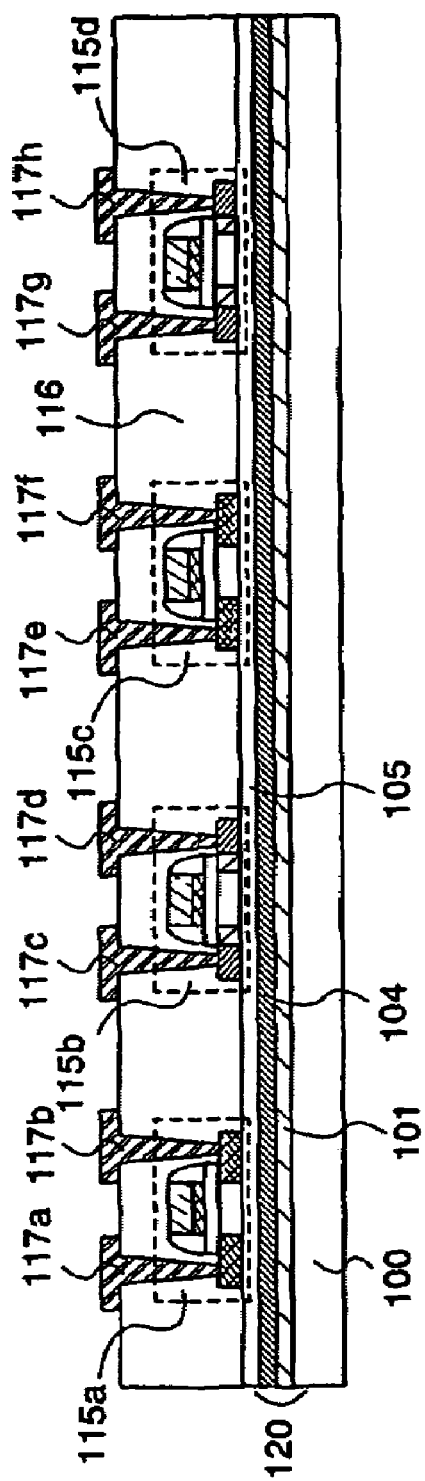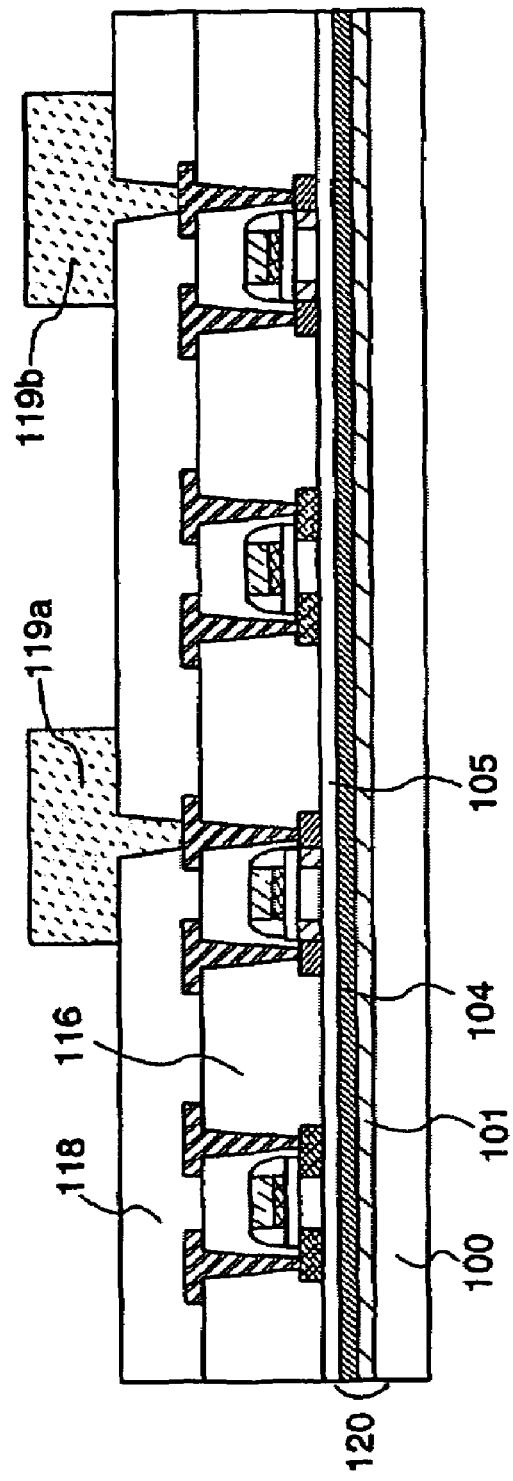
FIG. 3A
FIG. 3B

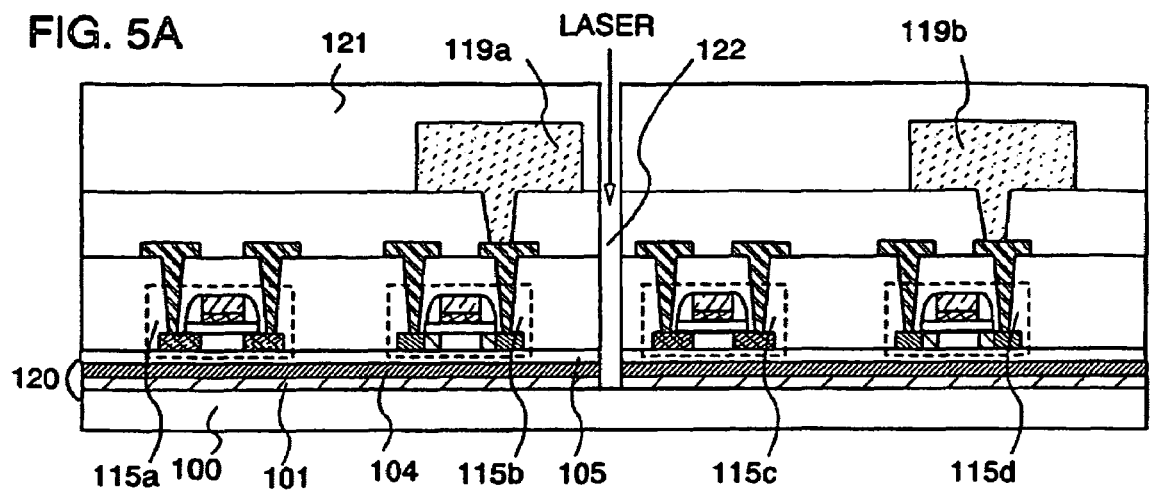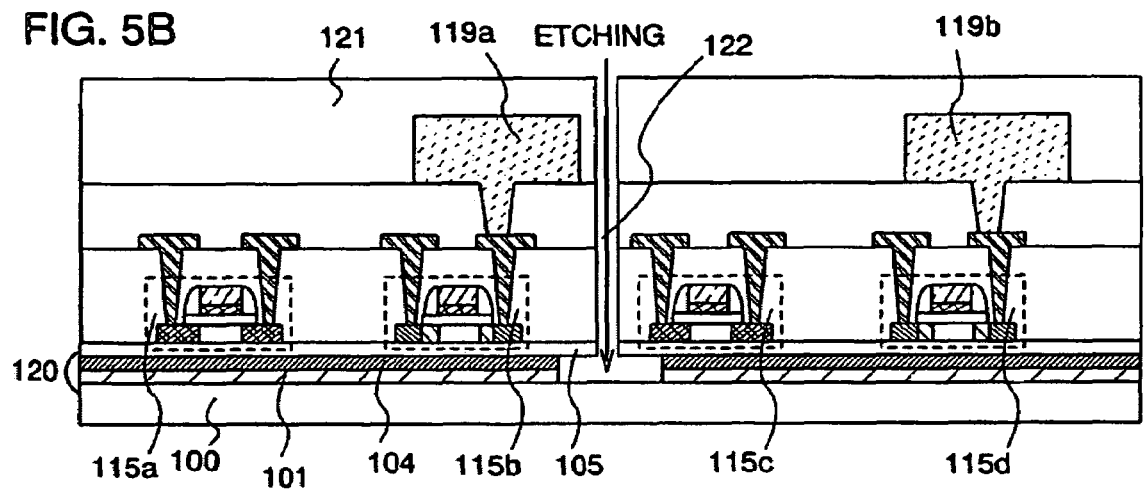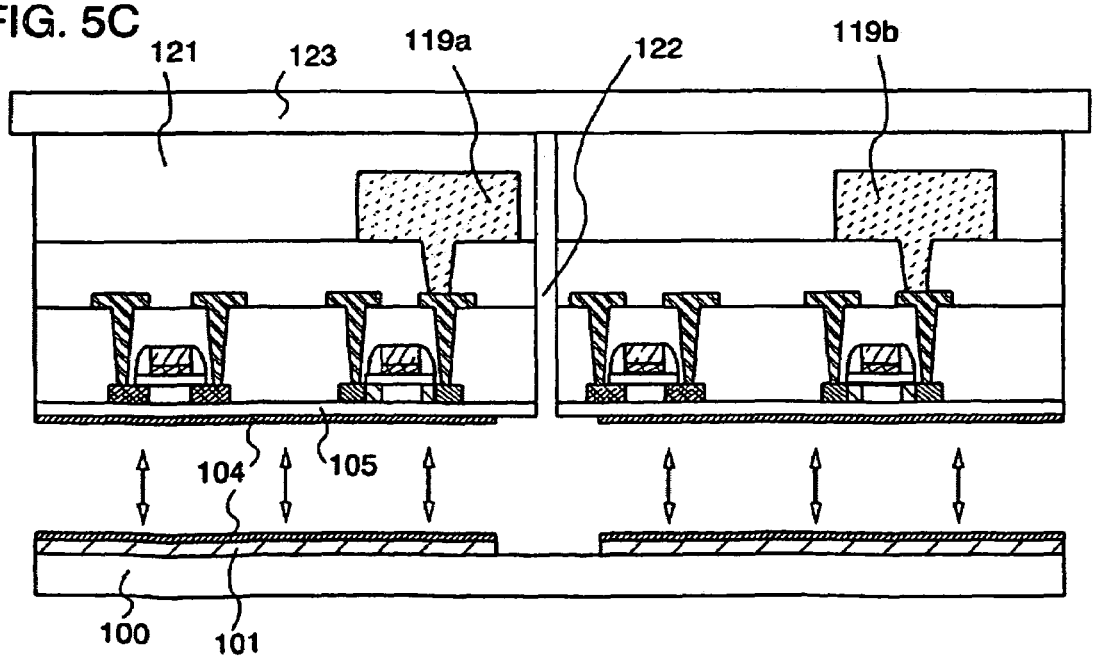

METHOD FOR MANUFACTURING SEMICONDUCTOR DEVICE, AND SEMICONDUCTOR DEVICE

BACKGROUND OF THE INVENTION

1. Field of the Invention

The present invention relates to a method for manufacturing a semiconductor device, and a semiconductor device manufactured by applying the method. In particular, the present invention relates to a manufacturing method of a semiconductor device by peeling off a transistor from a substrate with use of a peeling layer made of stacked layers of a metal film and a metal oxide film that are provided between the substrate and the transistor.

In this specification, a semiconductor device includes, in its category, an RFID (Radio Frequency Identification) tag, a memory, an integrated circuit, a CPU (Central Processing Unit), a microprocessor, and the other component or product. Note that an RFID tag is also referred to as a wireless IC tag.

2. Description of the Related Art

In recent years, the necessity of an RFID tag has been increased in any field that requires automatic identification such as management of products. In general, an RFID tag is a compact device provided with an antenna for wireless communication and a compact IC chip. The IC chip is formed of an integrated circuit having a transistor provided over a silicon wafer, and the like.

In recent years, various techniques such as a method of removing a substrate by grinding, polishing, or dissolving and a method of separating a transistor provided over a substrate from the substrate are considered for further reduction in cost and film thickness of an RFID tag. As a method of peeling off a thin film transistor provided over a substrate, for example, there is a technique by which a thin film transistor is provided over a substrate with a separating layer made of amorphous silicon interposed therebetween, and hydrogen contained in the amorphous silicon which is a separating layer is released by irradiating with a laser beam which is transmitted through the substrate from the substrate side, thereby separating the thin film transistor from the substrate (see Japanese Patent Application Laid-Open No. 10-125931)

However, the method of removing a substrate by grinding, polishing, or dissolving causes problems: a damage due to physical force such as stress, contamination, and the like. Further, in the case of employing the method of peeling off a thin film transistor by laser beam irradiation, it is necessary to use a substrate having high light transmissivity, and entire irradiation with a laser beam having relatively high energy is required to provide energy enough to make the laser beam pass through the substrate and release hydrogen contained in amorphous silicon. Therefore, it is a problem that a layer to be peeled is damaged. According to such methods, it is quite difficult to reuse a substrate and the cost is increased.

SUMMARY OF THE INVENTION

In view of the aforementioned problem, the present invention provides a manufacturing method of a thinned semiconductor device with high reliability at low cost and a semiconductor device manufactured by the method.

In the present invention, the following method is used to solve the aforementioned problem.

According to a manufacturing method of a semiconductor device disclosed in this specification, a peeling layer, a transistor, and an insulating layer are formed in this order over a substrate, an opening is formed so as to expose at least a part of the peeling layer, and the transistor is peeled off from the substrate by a physical means. The peeling layer is formed by forming a metal film and a metal oxide film so as to be in contact with the metal film by a method using a solution (wet method).

According to another manufacturing method of a semiconductor device disclosed in this specification, a peeling layer, a transistor, and an insulating layer are formed in this order over a substrate, an opening is formed so as to expose at least a part of the peeling layer, the peeling layer is removed by introducing an etchant into the opening while leaving a part thereof and the transistor is peeled off from the substrate by a physical means. The peeling layer is formed by forming a metal film and a metal oxide film so as to be in contact with the metal film by a method using a solution (wet method).

The transistor formed over the peeling layer is typically a thin film transistor.

The physical means is a means recognized not chemically but physically, which specifically means a dynamic means or a mechanical means having a step applicable to the Law of Dynamics and a means of changing some sort of dynamic energy (mechanical energy). That is, peeling using a physical means is to peel off by a shock (stress) applied externally using a human hand, pressure of a gas blown from a nozzle, ultrasonic waves, a load using a wedge-shaped member, or the like.

As the method using a solution for forming a metal oxide film over a metal film, for example, a coating drying method, a sol-gel method, a liquid-phase deposition method, or the like is used. Further, a metal oxide film may be formed by oxidizing a surface of a metal film. As such a method, a method using an oxidizing agent such as an ozone water solution, an anode oxidization method, or the like is given.

In order to form an opening so as to expose at least a part of a peeling layer, irradiation with a laser beam, or grinding or cutting an end surface of a substrate over which the peeling layer is formed is carried out.

In the case of manufacturing an RFID tag as a semiconductor device, a thin film transistor is formed over a substrate with a peeling layer interposed therebetween, an antenna is formed so as to be electrically connected to the thin film transistor, an insulating layer is formed over the thin film transistor and the antenna, and then the thin film transistor and the antenna are peeled off from the substrate.

Further, an RFID tag can be manufactured as follows. A thin film transistor is formed over a substrate with a peeling layer interposed therebetween. Thereafter, an antenna is not formed unlike the above description, and an insulating layer is formed over the thin film transistor. Then, the thin film transistor is peeled off from the substrate. After that, the peeled thin film transistor is electrically connected to an antenna (antenna formed over another substrate) which is prepared as a component.

By using the present invention, a metal oxide film included in a peeling layer can be formed thinly with high planarity by using a simpler apparatus and method compared to CVD or sputtering; therefore, the yield is improved. By a method of forming a metal oxide film with use of a solution according to the present invention, even a thin film with a thickness of 50 nm or less can be formed evenly. On the other hand, in the case where a thin film with a thickness of 50 nm or less is formed by sputtering, the film often has poor in-plane distribution, compared to the method using a solution of the invention. That is to say, the film thickness is often significantly varied in the same layer. Therefore, such a film formed by a sputtering method is inappropriate for a film included in a peeling layer.

Since forming the metal oxide film with use of a solution can be carried out by using a simple apparatus as described above, an area of a substrate can be enlarged, which is advantageous to industrialization. By the present invention, the metal oxide film can be formed at normal pressures or rough vacuum. Therefore, the present invention is appropriate for industrialization and mass production compared to the case of using CVD or sputtering. Further, by forming the metal oxide film thinly, even in the case where the metal oxide film is attached to a semiconductor device from which a substrate is peeled off, reduction in thickness of a semiconductor device can be achieved. Furthermore, since a substrate from which a transistor is peeled off can be reused, the manufacturing cost can be reduced.

BRIEF DESCRIPTION OF DRAWINGS

FIGS. 1A to 1C are cross sectional views showing manufacturing steps of a semiconductor device, according to Embodiment 1.

FIGS. 3A and 3B are cross sectional views showing manufacturing steps of a semiconductor device, according to Embodiment 1.

FIGS. 5A to 5C are cross sectional views each showing a step of peeling off a semiconductor device from a substrate, according to Embodiment 3.

DETAILED DESCRIPTION OF THE INVENTION

Figure 2A:
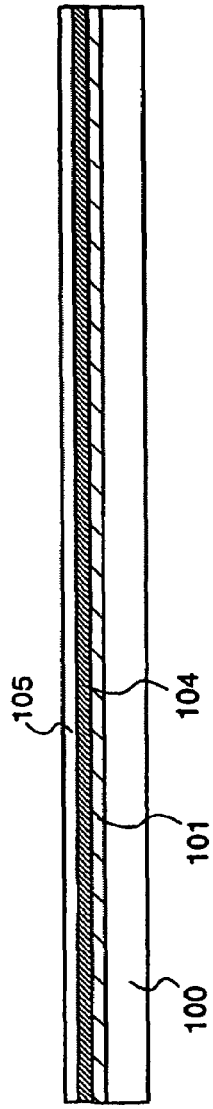
FIGS. 2A to 2D are cross sectional views showing manufacturing steps of a semiconductor device, according to Embodiment 1.

Although the present invention will be fully described below by way of embodiment modes and embodiments with reference to the accompanying drawings, it is to be understood that various changes and modifications will be apparent to those skilled in the art. Therefore, unless such changes and modifications depart from the scope of the present invention, they should be construed as being included therein.

Embodiment Mode 1

In this embodiment mode, description is made of a method of forming a metal oxide film.

First, a metal alkoxide is used as a component to form a metal oxide film. As a metal of the metal alkoxide, tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or the like is preferable. Note that the metal alkoxide may be prepared from a chloride of one of the aforementioned metals.

A sol is prepared by adding a stabilizer and water to a solution in which this metal alkoxide is dissolved in a proper solvent. As the solvent, for example, tetrahydrofuran (THF), xylene, acetonitrile, dichloromethane, dichloroethane, or a mixed solvent of at least two of these can be used, as well as lower alcohol such as methanol, ethanol, n-propanol, i-propanol, n-butanol, or sec-butanol. However, the present invention is not limited to these solvents.

As the stabilizer, β-diketone such as acetylacetone, ethyl acetoacetate, or benzoylacetone are given, for example. It is to be noted that the stabilizer is not necessarily required since it is provided to maintain a chelate complex.

The amount of water to be added is preferably 2 to 6 equivalents with respect to a metal alkoxide, since the metal of the alkoxide generally is divalent to hexavalent. It is to be noted that water is not necessarily required since water is used to control the progress of a reaction of the metal alkoxide.

Subsequently, the prepared sol is applied to a substrate and baked, thereby forming a metal oxide film over the substrate. As a method for application, a wet method such as dip coating, spin coating, or an ink-jet method can be adopted. However, the present invention is not limited to the methods.

Note that a binder substance may be added in advance to the prepared sol, in the case of adding the binder substance. As the binder substance, polyvinyl alcohol (abbreviated as PVA), polymethyl methacrylate (abbreviated as PMMA), polycarbonate (abbreviated as PC), a phenol resin, and the like are given.

Embodiment Mode 2

In this embodiment mode, description is made of a method of forming a metal oxide film by a different manufacturing method from that described in Embodiment mode 1.

First, a metal alkoxide is used to form a metal oxide film. As a metal of the metal alkoxide, tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or the like is preferable. Note that the metal alkoxide may be prepared from a chloride of one of the aforementioned metals.

Subsequently, a stabilizer is added to a solution made by dissolving this metal alkoxide in a proper solvent. As the solvent, for example, tetrahydrofuran (THF), xylene, acetonitrile, dichloromethane, dichloroethane, or a mixed solvent of at least two of these can be used, as well as lower alcohol such as methanol, ethanol, n-propanol, i-propanol, n-butanol, or sec-butanol. However, the present invention is not limited to these solvents.

After that, the solution (sol) to which a stabilizer is added is applied to a substrate, which is exposed to water vapor, and then baked, thereby forming a metal oxide film. As a method for application, a wet method such as dip coating, spin coating, or an ink-jet method can be adopted. However, the present invention is not limited to the methods.

Note that, as the stabilizer, β-diketone such as acetylacetone, ethyl acetoacetate, or benzoylacetone is given, for example. By adding the stabilizer, polynuclear precipitation of hydroxide of a metal due to moisture in the air or the like, can be suppressed. It is to be noted that a stabilizer is not necessarily required, if the manufacturing process can be carried out in an environment with no moisture until being exposed to water vapor, and a chelate complex can be maintained.

Note that as a result of exposing the solution to water vapor after application, a hydrolysis reaction of the metal alkoxide occurs. Then, it is baked so that polymerization or cross-linking reaction proceeds.

Note that a binder substance may be added in advance to the solution (sol) to which a stabilizer is added, in the case of adding the binder substance. As for the binder substance, those described in Embodiment Mode 1 may be used.

Embodiment Mode 3

In this embodiment mode, description is made of a method of forming a metal oxide film by a different method from those described in Embodiment modes 1 and 2.

First, an ammonia water solution is dropped into a solution of acid salt containing a metal to obtain a polynuclear precipitate of hydroxide of a metal. As the metal, tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or the like is preferable.

The obtained precipitation is added into acid such as acetic acid and refluxed to be deflocculated. Accordingly, a sol is obtained. Thereafter, by applying and baking the obtained sol over a substrate, a metal oxide film is formed. As the method for application, a wet method such as dip coating, spin coating, or an ink-jet method can be adopted. However, the present invention is not limited to the methods.

Note that a binder substance may be added in advance to the sol, in the case of adding the binder substance. As for the binder substance, those described in Embodiment Mode 1 may be used.

In Embodiment Modes 1 to 3, the thickness of the metal oxide film such as a tungsten oxide film is in the range of 1 nm to 50 nm, preferably, 10 nm or less; however, it may be more than 10 nm, or less than 1 nm.

Embodiment 1

Description is made with reference to drawings of a manufacturing method of a semiconductor device over a peeling layer formed by using a metal oxide film over a substrate. In this embodiment, a thin film transistor abbreviated as a TFT is formed as a transistor.

As shown in FIG. 1A, a substrate 100 is prepared and a metal film 101 is provided over the substrate. Specifically, as the substrate 100, for example, a glass substrate such as a barium borosilicate glass substrate or an alumino-borosilicate glass substrate, a quartz substrate, a ceramic substrate, or the like may be used. A metal substrate including stainless steel or a semiconductor substrate over which an insulating film is formed may also be used. The substrate 100 may be thinned or planarized by a polishing method such as mechanical polishing or CMP (chemical mechanical polishing). A substrate formed of a flexible synthetic resin such as plastic generally tends to have lower heat resistance than the aforementioned glass substrate, quartz substrate, and ceramic substrate; however, a substrate formed of a flexible synthetic resin such as plastic can be used as the substrate 100 as long as the substrate can withstand treating temperature in the manufacturing steps.

The metal film 101 is shown in FIG. 1A as being provided entirely over the substrate 100. Further, after that, the metal film 101 may be formed into a desired pattern by photolithography or the like, as required.

Note that in FIG. 1A, the metal film 101 is formed directly on the substrate 100; however, a base layer which is not shown may be formed of an insulating layer of silicon oxide, silicon nitride, silicon oxide containing nitrogen (silicon oxynitride), silicon nitride containing oxygen, or the like between the substrate 100 and the metal film 101. In particular, in the case where contamination from the substrate is concerned, the base layer is preferably formed. When a glass substrate or a quartz substrate is used as the substrate 100, the base layer can be formed by carrying out plasma oxidation or plasma nitridation to a surface of the substrate 100 by an apparatus capable of generating plasma having high electron density of $1 \times 10^{11}$ cm$^{-3}$ or more, for example, $1 \times 10^{12}$ cm$^{-3}$ to $1 \times 10^{13}$ cm$^{-3}$ and low electron temperature of 1.5 eV or less, for example, 0.5 eV to 1.0 eV with no magnetic field. Alternatively, the base layer may be formed by carrying out plasma oxidation or plasma nitridation to the aforementioned insulating layer which is formed by plasma CVD by an apparatus capable of generating the plasma having high electron density and low electron temperature with no magnetic field. Formation of the insulating film and either plasma oxidation or plasma nitridation may be continuously carried out. On this occasion, a multi-chamber apparatus provided with a chamber for plasma CVD and a chamber for plasma treatment can be used.

The metal film 101 is formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and the like or an alloy material or a compound material which mainly contains the aforementioned element by sputtering, plasma CVD, or the like.

Subsequently, a metal oxide film 104 is formed over the metal film 101. Hereinafter, description is made with reference to FIGS. 1B and 1C of a method of forming a tungsten oxide film as the metal oxide film 104.

First, tungsten(V)pentaisopropoxide oxide is put into xylene which is a solvent. Further, ethyl acetoacetate is put as a stabilizer and stirred to prepare a solution (sol).

After that, as shown in FIG. 1B, the substrate 100 over which the metal film 101 is formed is disposed over a spin coater 102 and coated with the solution (sol) by spin coating. An arrow in FIG. 1B shows a state in which the spin coater 102 is rotated. The solution (sol) coating the metal film 101 is denoted by a reference numeral 103. Subsequently, the substrate is hydrolyzed with water vapor for 2 hours under conditions of 40° C. at 1 atmosphere.

Next, the substrate is baked for 1.5 hour at 120° C. under a reduced pressure using a rotary pump. Through the aforementioned steps, a tungsten oxide film is formed as the metal oxide film 104 as shown in FIG. 1C. The thickness of the tungsten oxide film is 1 nm to 50 nm, preferably, 10 nm or less; however, it may be 10 nm or more, or 1 nm or less.

The method of forming the metal oxide film 104 is not limited to the aforementioned method. Any method described in the embodiment modes of this specification may be used. The metal oxide film 104 and the metal film 101 are collectively referred to as a peeling layer 120.

The metal oxide film 104 is formed of a metal selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and the like.

Subsequently, an insulating layer 105 serving as a base of a thin film transistor to be formed in a subsequent step is formed over the metal oxide film 104 (see FIG. 2A). In order to obtain the insulating layer 105, a single layer or stacked layers containing an oxide of silicon or a nitride of silicon are formed by sputtering, plasma CVD, or the like. An oxide of silicon is a substance containing silicon (Si) and oxygen (O), and corresponds to silicon oxide, silicon oxide containing nitrogen, and the like. A nitride of silicon is a substance containing silicon and nitrogen (N), and corresponds to silicon nitride, silicon nitride containing oxygen, and the like. The insulating layer 105 serving as a base functions as a blocking film for preventing impurities from entering into a channel region of the thin film transistor from the substrate 100. After the layer containing an oxide of silicon or a nitride of silicon is formed by sputtering, plasma CVD, or the like, plasma oxidation or plasma nitridation may be carried out by an apparatus generating the plasma having high electron density and low electron temperature with no magnetic field. Formation of the film and either plasma oxidation or plasma nitridation may be continuously carried out. On this occasion, a multi-chamber apparatus provided with a chamber for plasma CVD and a chamber for plasma treatment can be used.

Figure 2B:
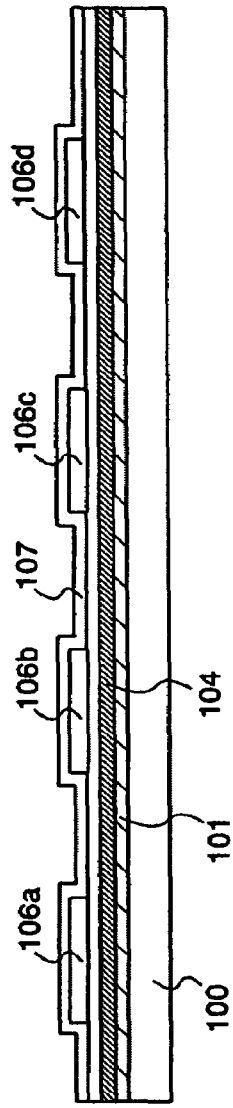

Next, an amorphous semiconductor layer is formed over the insulating layer 105 by sputtering, LPCVD, plasma CVD, or the like. Subsequently, the amorphous semiconductor layer is crystallized by laser crystallization, thermal crystallization using RTA or an annealing furnace, thermal crystallization using a metal element that accelerates crystallization, laser crystallization combined with thermal crystallization using a metal element that accelerates crystallization, or the like, thereby forming a crystalline semiconductor layer. Then, the obtained crystalline semiconductor layer is formed into a desired pattern, thereby forming crystalline semiconductor layers 106a to 106d (see FIG. 2B).

An example of forming steps of the crystalline semiconductor layers 106a to 106d is described below. First, an amorphous semiconductor layer is formed by plasma CVD. After a solution containing nickel that is a metal element for accelerating crystallization is retained on the surface of the amorphous semiconductor layer, the amorphous semiconductor layer is subjected to dehydrogenation treatment (for example, treating temperature: 500° C., treating time: one hour) and crystallization (for example, treating temperature: 550° C., treating time: four hours), thereby forming a crystalline semiconductor layer. Then, the crystalline semiconductor layer is irradiated with a laser beam as required, and a photolithography method is used to form the crystalline semiconductor layers 106a to 106d. If the crystalline semiconductor layers 106a to 106d are formed by laser crystallization, a gas laser or a solid-state laser is used. The gas laser and the solid-state laser may be either a continuous wave laser or a pulsed laser.

When the amorphous semiconductor layer is crystallized using a metal element that accelerates crystallization, there is the advantages that crystallization can be carried out at a low temperature in a short time and crystals can be aligned in the same direction. On the other hand, off-current increases since the metal element remains in the crystalline semiconductor layers, which leads to variations in characteristics. Accordingly, an amorphous semiconductor layer functioning as a gettering site is preferably formed over the crystalline semiconductor layers. The amorphous semiconductor layer functioning as a gettering site is required to contain an impurity element such as phosphorus or argon; therefore, it is preferably formed by sputtering so as to contain argon at a high concentration. Then, a metal element is diffused in the amorphous semiconductor layer by heat treatment such as thermal annealing using RTA or an annealing furnace, and the amorphous semiconductor layer containing the metal element is removed. As a result, the metal element contained in the crystalline semiconductor layers can be reduced or removed.

Subsequently, a gate insulating layer 107 is formed so as to cover the crystalline semiconductor layers 106a to 106d. In order to obtain the gate insulating layer 107, a single layer or stacked layers are formed by plasma CVD, sputtering, or the like using an oxide of silicon or a nitride of silicon. After the gate insulating layer 107 is formed by plasma CVD, sputtering, or the like, plasma oxidation or plasma nitridation may be carried out by a device capable of generating the plasma having high electron density and low electron temperature with no magnetic field. Formation of the film and either plasma oxidation or plasma nitridation may be continuously carried out. On this occasion, a multi-chamber apparatus provided with a chamber for plasma CVD and a chamber for plasma treatment can be used. Alternatively, the gate insulating layer 107 may be formed by carrying out plasma oxidation or plasma nitridation to the crystalline semiconductor layers 106a to 106d.

A first conductive layer and a second conductive layer are stacked over the gate insulating layer 107. The first conductive layer is formed by plasma CVD, sputtering, or the like so as to have a thickness of 20 to 100 nm. The second conductive layer is formed by the same method as that of the first conductive layer so as to have a thickness of 100 to 400 nm. The first conductive layer and the second conductive layer are formed of an element selected from tantalum (Ta), tungsten (W), titanium (Ti), molybdenum (Mo), aluminum (Al), copper (Cu), and chromium (Cr), or an alloy material or a compound material that mainly contains these elements. Alternatively, the first conductive layer and the second conductive layer are formed of a semiconductor material typified by polycrystalline silicon doped with an impurity element such as phosphorus. The first conductive layer and the second conductive layer may be formed of, for example, a tantalum nitride layer and a tungsten layer, a tungsten nitride layer and a tungsten layer, a molybdenum nitride layer and a molybdenum layer, or the like. If the first conductive layer and the second conductive layer are formed of tungsten or tantalum nitride that has high heat resistance, they may be subjected to heat treatment for thermal activation. In the case where a three-layer structure is adopted instead of the two-layer structure, a molybdenum layer, an aluminum layer and a molybdenum layer are preferably stacked.

Figure 2C:
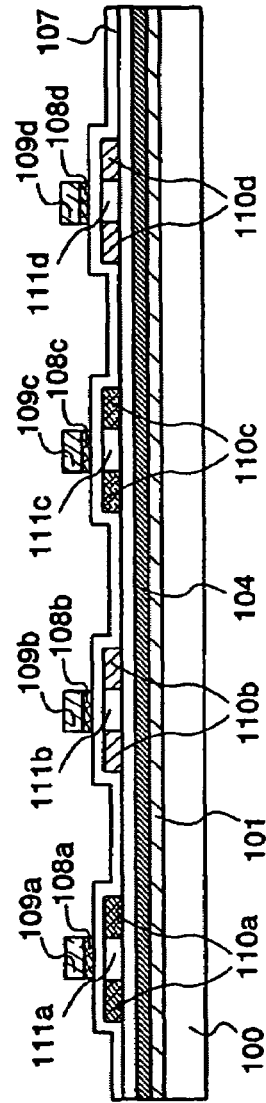

A resist mask is formed by photolithography, and conductive layers 108a and 109a, 108b and 109b, 108c and 109c, and 108d and 109d that function as gate electrodes are formed by etching for forming gate electrodes and gate wires that extend from the gate electrodes (see FIG. 2C).

A low concentration of an impurity element imparting N-type conductivity is added to the crystalline semiconductor layers 106b and 106d by ion doping or ion implantation, thereby forming impurity regions 110b and 110d and channel forming regions 111b and 111d. Further, an impurity element imparting P-type conductivity is added to the crystalline semiconductor layers 106a and 106c, thereby forming source or drain regions 110a and 110c and channel forming regions 111a and 111c (see FIG. 2C). When the impurity element is added, a mask (resist mask) is formed as required so as to cover a region to which impurities are not added. The impurity element imparting N-type conductivity may be an element belonging to group 15 of the periodic table, and for example, phosphorus (P) or arsenic (As) may be used. As the impurity element imparting P-type conductivity, for example, boron (B) is used.

Figure 2D:
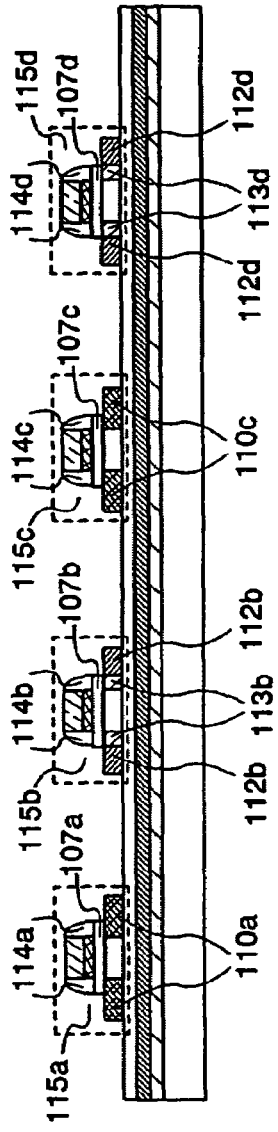

An insulating layer which is not shown is formed to cover the gate insulating layer 107 and the conductive layers 108a and 109a, 108b and 109b, 108c and 109c, and 108d and 109d that function as gate electrodes. In order to obtain the insulating layer, a single layer or stacked layers are formed by plasma CVD, sputtering, or the like using a layer containing an inorganic material such as silicon, an oxide of silicon, and a nitride of silicon, or a layer containing an organic material such as an organic resin. Then, the insulating layer is selectively etched by anisotropic etching that is mainly in the direction perpendicular to the surface of the substrate, thereby forming sidewalls 114a to 114d in contact with the sides of the conductive layers 108a and 109a, 108b and 109b, 108c and 109c, and 108d and 109d (see FIG. 2D). While forming the sidewalls 114a to 114d, gate insulating layers 107a to 107d may be formed by etching the gate insulating layer 107. In this embodiment, the sidewalls 114a to 114d are used as masks in a subsequent doping step for forming LDD (Lightly Doped Drain) regions; however, the LDD regions can be formed by another method. Therefore, the sidewalls are not necessarily required.

A mask (resist mask) is formed so as to cover a region to which impurities are not added by photolithography or the like. Then, an impurity element imparting N-type conductivity is added to the crystalline semiconductor layers 106b and 106d using the mask and the sidewalls 114a to 114d, thereby forming source or drain regions 112b and 112d. At the same time, LDD regions 113b and 113d are formed. The concentration of the impurity element imparting N-type conductivity in the LDD regions 113b and 113d is lower than that in the source or drain regions 112b and 112d. Through the aforementioned steps, N-channel thin film transistors 115b and 115d and P-channel thin film transistors 115a and 115c are formed.

Subsequently, an insulating layer 116 is formed of a single layer or stacked layers so as to cover the source or drain regions 110a, 112b, 110c, and 112d, and the conductive layers 108a and 109a, 108b and 109b, 108c and 109c, and 108d and 109d that function as gate electrodes of the thin film transistors 115a to 115d (see FIG. 3A). In order to obtain the insulating layer 116 which is also referred to as an interlayer insulating layer, a single layer or stacked layers are formed by SOG, droplet discharging, CVD, sputtering, or the like using an inorganic material such as an oxide of silicon, a nitride of silicon, or the like, an organic material such as polyimide, polyamide, benzocyclobutene, acrylic, epoxy, or an oxazole resin, or a siloxane material. An oxazole resin is suitable for the interlayer insulating layer since the oxazole resin has lower dielectric constant than polyimide and can suppress generation of parasitic capacitance. An organic group containing at least hydrogen (such as an alkyl group and aromatic hydrocarbon) is used as a substituent of a siloxane material. Alternatively, a siloxane material is composed of a skeleton formed of the bond of silicon (Si) and oxygen (O), in which a fluoro group and an organic group containing at least hydrogen may be used as the substituent.

If the insulating layer 116 has, for example, a two-layer structure, an inorganic layer containing silicon nitride or silicon oxide may be formed as a first insulating layer, and a resin layer may be formed as a second insulating layer. In forming the first inorganic layer, plasma oxidation or plasma nitridation may be carried out by an apparatus capable of generating the plasma having high electron density and low electron temperature with no magnetic field. Formation of the inorganic film and either plasma oxidation or plasma nitridation may be continuously carried out. On this occasion, a multi-chamber apparatus provided with a chamber for sputtering or CVD and a chamber for plasma treatment can be used.

Before forming the first and second insulating layers or after forming one or both of the first and second insulating layers, heat treatment is preferably carried out for recovery of the crystallinity of the semiconductor layers, activation of the impurity elements added to the semiconductor layers, and hydrogenation of the semiconductor layers. As the heat treatment, thermal annealing, laser annealing, RTA or the like may be adopted.

Next, the insulating layer 116 is etched by photolithography or the like, thereby forming openings to partially expose the source or drain regions 110a, 112b, 110c, and 112d. Then, conductive layers which are electrically connected to the source or drain regions 110a, 112b, 110c, and 112d are formed over the insulating layer 116 so as to fill in the openings, and patterned to form conductive layers 117a to 117h functioning as source or drain wires.

Structures of the thin film transistors 115a to 115d are not limited to the structures shown in drawings. Other structure may be adopted, such as a multi-gate structure, an inverted staggered structure, or a structure in which at least a part of an LDD region is provided so as to overlap a gate electrode. Further, the conductive layers 117a and 117b may be considered to be included in the thin film transistor 115a. In the same manner, the conductive layers 117c and 117d, 117e and 117f, and 117g and 117h may be considered to be included in the thin film transistors 115b, 115c, and 115d, respectively. The thin film transistors 115a to 115d (including the conductive layers 117a to 117h) and the insulating layer 116 are collectively referred to as a layer having thin film transistors.

In order to obtain the conductive layers 117a to 117h, a single layer or stacked layers are formed by plasma CVD, sputtering, or the like using an element selected from titanium (Ti), aluminum (Al), and neodymium (Nd), or an alloy material or a compound material mainly containing these elements. The alloy material mainly containing aluminum corresponds to, for example, a material that mainly contains aluminum and contains nickel, a material that mainly contains aluminum and contains silicon, or a material that mainly contains aluminum and contains one or more of nickel, carbon, and silicon. The conductive layers 117a to 117h may adopt, for example, a stacked layer structure of a barrier layer, an aluminum layer containing silicon, and a barrier layer, or a stacked layer structure of a barrier layer, an aluminum layer containing silicon, a titanium nitride layer, and a barrier layer. It is to be noted that an aluminum layer containing silicon contains silicon of 0.1 to 5 wt %. In addition, the barrier layer corresponds to a thin film formed of titanium, a nitride of titanium, molybdenum, or a nitride of molybdenum. Aluminum and aluminum containing silicon are optimal for the material of the conductive layers 117a to 117h since they have a low resistance value and are inexpensive. When barrier layers are provided as upper and lower layers, hillock generation of aluminum or aluminum containing silicon can be prevented. Further, when the barrier layer is formed of titanium that has high reducing capability, a thin natural oxide film which may possibly be formed over the crystalline semiconductor layers can be reduced, and disconnection between the barrier layer and the crystalline semiconductor layers can be prevented.

Subsequently, an insulating layer 118 is formed so as to cover the conductive layers 117a to 117h (see FIG. 3B). The insulating layer 118 is formed by SOG, droplet discharging, or the like using an inorganic material such as oxide of silicon or nitride of silicon, an organic material such as polyimide, polyamide, benzocyclobutene, acrylic, epoxy, or an oxazole resin, or a siloxane material.

Openings are formed so as to expose the conductive layers 117d and 117h. Conductive layers 119a and 119b that function as antennas are formed over the insulating layer 118 so as to fill the openings and electrically connect to the conductive layers 117d and 117h (see FIG. 3B). In order to obtain the conductive layers 119a and 119b, a single layer or stacked layers are formed by plasma CVD, sputtering, printing, droplet discharging, or the like using a conductive material such as an element selected from aluminum (Al), titanium (Ti), silver (Ag), and copper (Cu), or an alloy material or a compound material mainly containing these elements. Specifically, the conductive layers 119a and 119b are formed by screen printing using conductive metal paste and then applying heat treatment at a temperature of 50 to 350° C. Alternatively, the conductive layers 119a and 119b may be obtained by forming an aluminum layer by sputtering and then patterning the aluminum layer. The aluminum layer is preferably patterned by wet etching, and then subjected to heat treatment at a temperature of 200 to 300° C.

The conductive layers 119a and 119b can be formed in an annular shape (for example, a loop antenna), a spiral shape (for example, a spiral antenna), a linear shape (for example, a dipole antenna), or a flat shape (for example, a patch antenna). In the case of applying radio frequency of a UHF band of 860 to 960 MHz or a frequency band of 2.45 GHz, either a shape for forming a dipole antenna or a shape for forming a patch antenna may be adopted as a signal transmitting method. Through the aforementioned steps, an RFID tag can be formed over the substrate 100 with the peeling layer 120 interposed therebetween. Note that this embodiment can be freely combined with Embodiment Modes 1 to 3.

Embodiment 2

In this embodiment, description is made with reference to drawings of a method of peeling off an RFID tag which is the semiconductor device formed over the substrate 100 with the peeling layer 120 interposed therebetween.

The substrate 100 manufactured according to Embodiment 1 is prepared, over which the peeling layer 120, the thin film transistors 115a to 115d, and the conductive layers 119a and 119b functioning as antennas are provided.

Figure 4A:
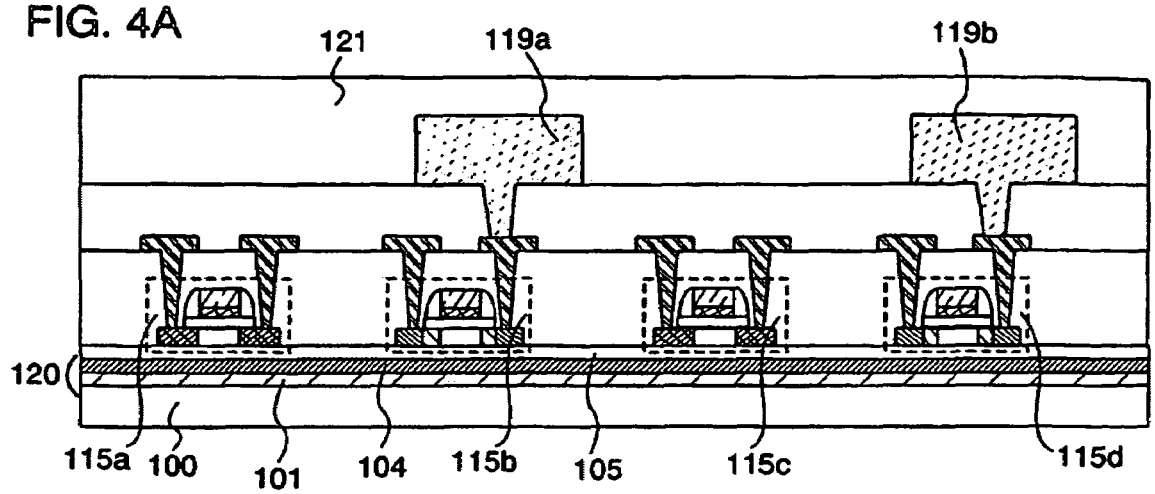
FIGS. 4A to 4C are cross sectional views showing a step of peeling off a semiconductor device from a substrate, according to Embodiment 2.

An insulating layer 121 is formed so as to cover the conductive layers 119a and 119b (see FIG. 4A). The insulating layer 121 is formed by SOG, droplet discharging, screen printing, coating, or the like using an inorganic material such as an oxide of silicon or a nitride of silicon, an organic material such as polyimide, polyamide, benzocyclobutene, acrylic, epoxy, or an oxazole resin, or a siloxane material.

Figure 4B:
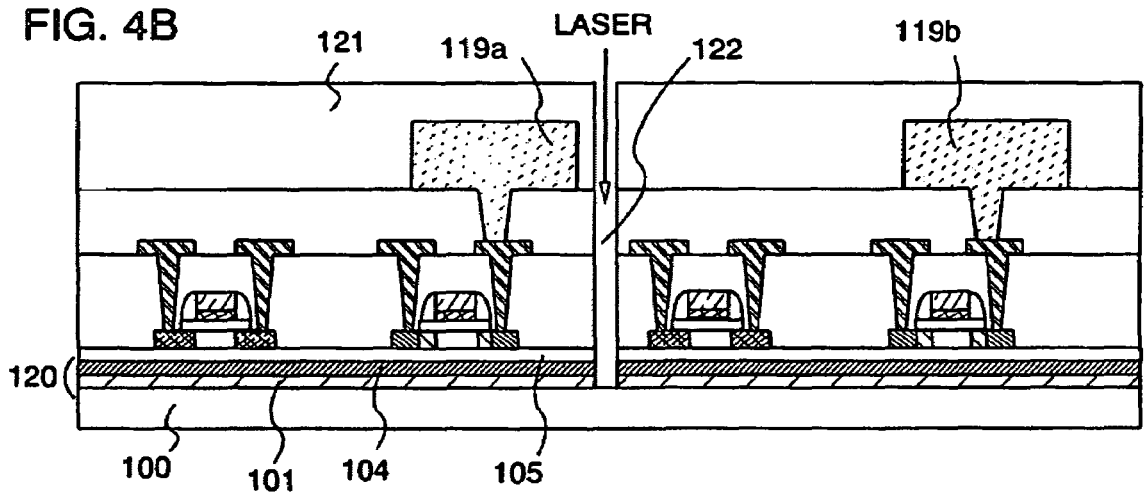

An opening 122 is formed so as to expose at least a part of the peeling layer 120 by irradiating with a laser beam (see FIG. 4B). Note that as the laser beam, for example, a harmonic of a laser for which a solid such as Nd:YVO$_4$ is used as a medium, excimer laser, or the like, which has a wave length in an ultraviolet light region, can be used. It is to be noted that a type of the laser beam is not limited as long as the opening 122 is formed.

As another method of exposing at least a part of the peeling layer 120, grinding, cutting, or the like is given. However, by the method of forming an opening by irradiating with a laser beam, at least a part of the peeling layer 120 can be exposed more easily in a shorter time compared to the other methods. By any method, the peeling layer 120 is desirably exposed in a region where the peeling layer 120 does not overlap with a thin film transistor, that is, a region where a thin film transistor is not provided over the peeling layer 120.

Figure 4C:
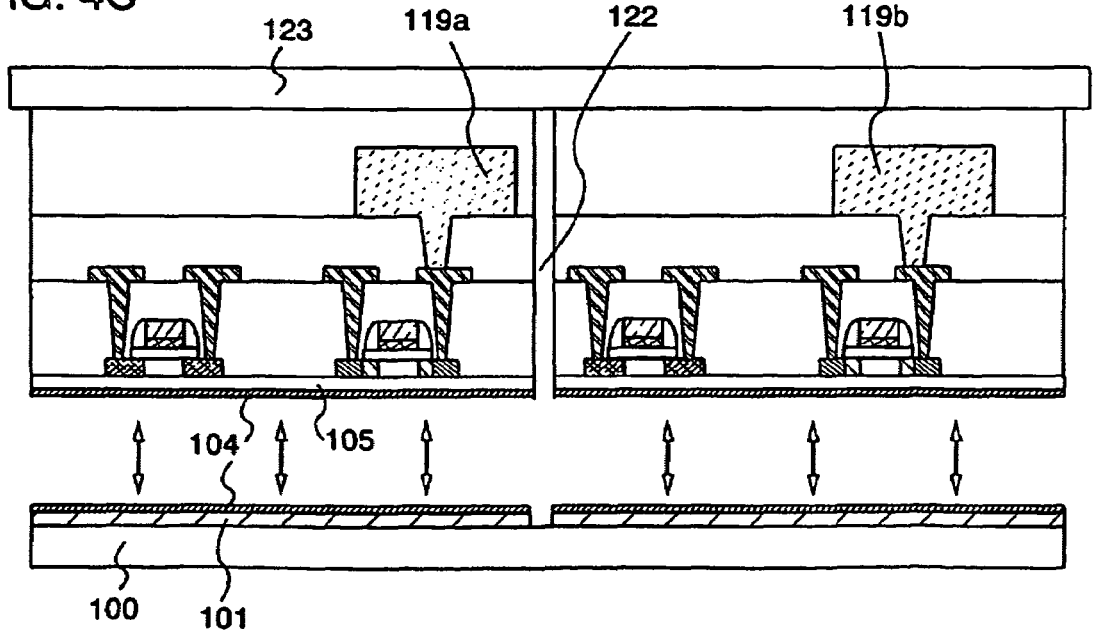

Next, a substrate 123 is adhered to the insulating layer 121 to completely peel off the transistor from the substrate 100 by using a physical means. In FIG. 4C, the metal oxide film 104 itself is separated into the substrate 100 side and the substrate 123 side. However, the separation may occur at an interface between the metal film 101 and the metal oxide film 104, or at an interface between the metal oxide film 104 and the insulating film 105.

As the substrate 123, a film made of polypropylene, polyester, vinyl, polyvinyl fluoride, polyvinyl chloride, or the like, paper of a fibrous material, a stacked film of a base film (polyester, polyamide, an inorganic vapor deposited film, paper, or the like) and an adhesive synthetic resin film (an acrylic-based synthetic resin, an epoxy-based synthetic resin, or the like), or the like is used. Heat treatment and pressure treatment are carried out to the film and a subject. In carrying out the heat treatment and the pressure treatment, an adhesive layer that is provided on the outermost surface of the film is melted by heat treatment and adhered by applying pressure. The adhesive layer corresponds to a layer containing an adhesive such as a heat curing resin, an ultraviolet curing resin, a vinyl acetate resin-based adhesive, a vinyl copolymer resin-based adhesive, an epoxy resin-based adhesive, an urethane resin-based adhesive, a rubber-based adhesive, and an acrylic resin-based adhesive.

If the substrate 123 is formed of plastic, it can be easily processed into a good design and flexible shape since plastic is thin and lightweight and can be bent. In addition, a plastic substrate has high impact resistance and can be easily adhered to or implanted in various products, which leads to applications in various fields.

Peeling by using the physical means is to peel by a shock (stress) externally given using a human hand, pressure of a gas blown from a nozzle, ultrasonic waves, a load using a wedge-shaped member, or the like.

After that, another substrate may be adhered to a side opposite to the substrate 123, that is, a substrate 100 side, thereby protecting the manufactured RFID tag. In this case, a material of another substrate may be selected from the materials of the substrate 123.

The substrate 100 from which the thin film transistors 115a to 115d are peeled off is preferably reused for cost reduction.

This embodiment can be freely combined with Embodiment Modes 1 to 3 and Embodiment 1.

Embodiment 3

In this embodiment, description is made with reference to drawings of a method of peeling off an RFID tag which is the semiconductor device formed over the substrate with the peeling layer interposed therebetween, which is different from that in Embodiment 2.

The thin film transistors 115a to 115d and the conductive layers 119a and 119b functioning as antennas are provided over the substrate 100. The insulating layer 121 is formed so as to cover the conductive layers 119a and 119b. Subsequently, the opening 122 is formed so as to expose at least a part of the peeling layer 120 by irradiation with a laser beam or the like (see FIG. 5A). These steps are the same as those described in Embodiment 2.

After the opening 122 is formed, the peeling layer 120 is removed by introducing an etchant into the opening 122 while leaving a part of the peeling layer 120 (see FIG. 5B). As the etchant, a gas or a liquid containing halogen fluoride is used. For example, chlorine trifluoride ($ClF_3$), nitrogen trifluoride ($NF_3$), or bromine trifluoride ($BrF_3$) is given.

Next, a substrate 123 is adhered to the insulating layer 121 to completely peel off the transistor from the substrate 100 by using a physical means (see FIG. 5C). In FIG. 5C, the metal oxide film 104 itself is separated into the substrate 100 side and the substrate 123 side. However, the separation may occur at an interface between the metal film 101 and the metal oxide film 104, or at an interface between the metal oxide film 104 and the insulating film 105.

As the substrate 123, a film made of polypropylene, polyester, vinyl, polyvinyl fluoride, polyvinyl chloride, or the like, paper of a fibrous material, a stacked film of a base film (polyester, polyamide, an inorganic vapor deposited film, paper, or the like) and an adhesive synthetic resin film (an acrylic-based synthetic resin, an epoxy-based synthetic resin, or the like), or the like is used. Heat treatment and pressure treatment are carried out to the film and a subject. In carrying out the heat treatment and the pressure treatment, an adhesive layer that is provided on the outermost surface of the film is melted by heat treatment and adhered by applying pressure. The adhesive layer corresponds to a layer containing an adhesive such as a heat curing resin, an ultraviolet curing resin, a vinyl acetate resin-based adhesive, a vinyl copolymer resin-based adhesive, an epoxy resin-based adhesive, an urethane resin-based adhesive, a rubber-based adhesive, and an acrylic resin-based adhesive.

If the substrate 123 is formed of plastic, it can be easily processed into a good design and flexible shape since plastic is thin and lightweight and can be bent. In addition, a plastic substrate has high impact resistance and can be easily adhered to or implanted in various products, which leads to applications in various fields.

It is to be noted that peeling by using the physical means is to peel by a shock (stress) externally given using a human hand, pressure of a gas emitted from a nozzle, ultrasonic waves, a load using a wedge-shaped member, or the like.

After that, another substrate may be adhered to a side opposite to the substrate 123, that is, a substrate 100 side, thereby protecting the manufactured RFID tag. In this case, a material of another substrate may be selected from the materials of the substrate 123.

The substrate 100 from which the thin film transistors 115a to 115d are peeled off is preferably reused for cost reduction.

This embodiment can be freely combined with Embodiment Modes 1 to 3 and Embodiments 1 and 2.

Embodiment 4

An example of an RFID tag manufactured using the transistor obtained by the present invention disclosed in this specification is shown. In this embodiment, a thin film transistor is used as a transistor.

Figure 6A:
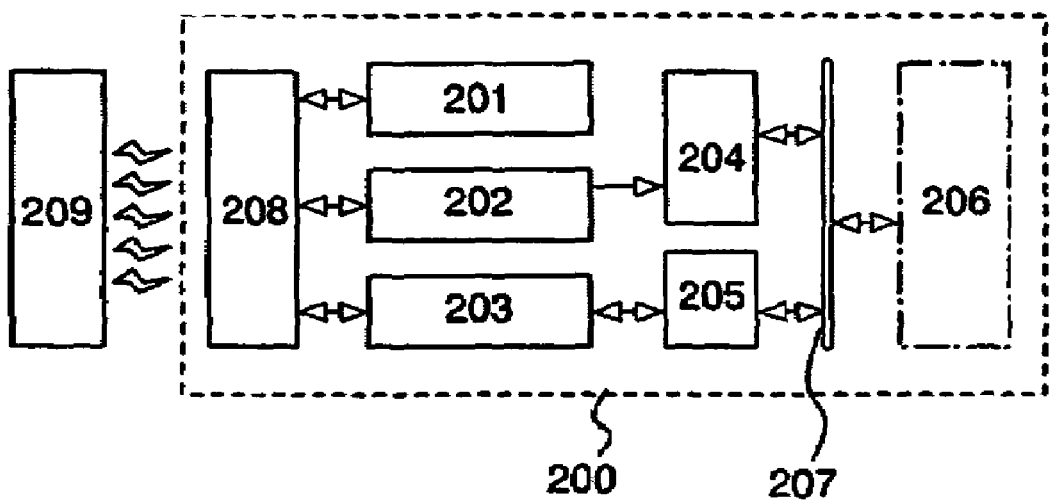
FIGS. 6A and 6B are block diagrams showing an example of an RFID tag.
Figure 6B:
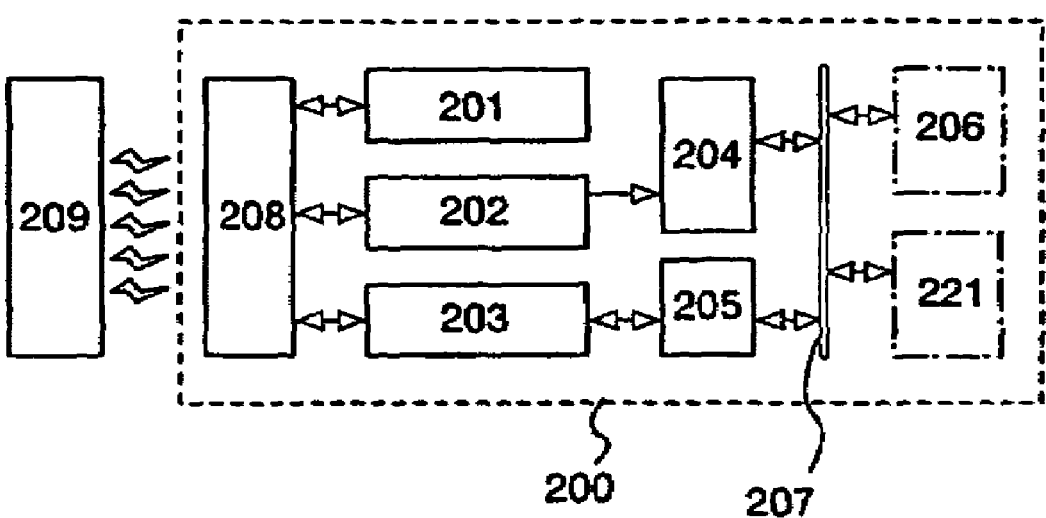
Figure 7A:
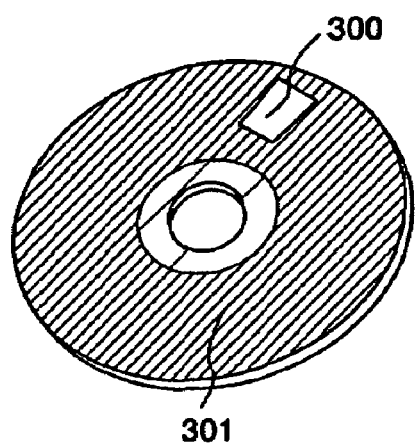
FIGS. 7A to 7D are views showing examples of uses of an RFID tag.
Figure 7B:
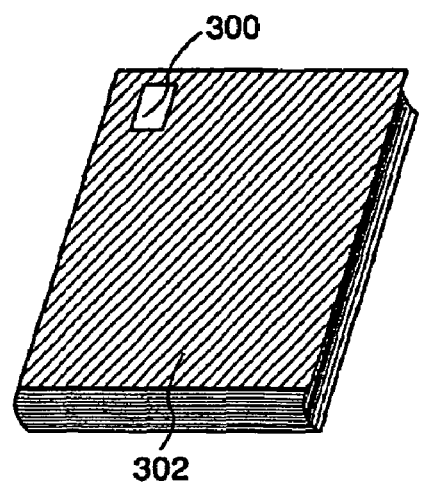
Figure 7C:
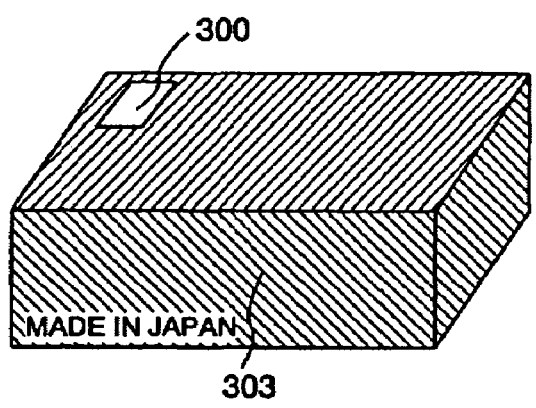
Figure 7D:
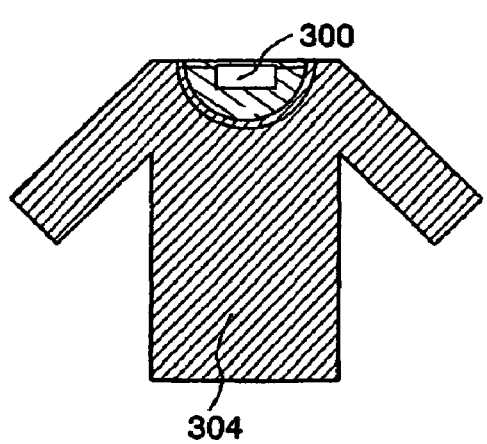

In FIGS. 6A and 6B, block diagrams of examples of the RFID tag are shown. An RFID tag 200 can communicate without contact, and includes a power source circuit 201, a clock generating circuit 202, a data demodulation/modulation circuit 203, a control circuit 204, an interface circuit 205, a memory device 206, a bus 207, and an antenna 208. FIG. 6B shows a case where a CPU 221 is provided in addition to the components of FIG. 6A.

The power source circuit 201 generates a power source based on an alternating signal that is inputted from the antenna 208. The clock generating circuit 202 generates a clock signal based on a signal that is inputted from the antenna 208. The data demodulation/modulation circuit 203 demodulates/modulates data that is communicated to/from a reader/writer 209. The control circuit 204 controls the memory device 206. The antenna 208 carries out transmission/reception of signals.

As the memory circuit 206, a DRAM, an SRAM, a mask ROM, an EPROM (Erasable Programmable Read Only Memory), an EEPROM (Electrically Erasable and Programmable Read Only Memory), a flash memory, an organic memory, or the like can be used. The organic memory has a structure in which an organic compound layer is provided between a pair of electrodes or a structure in which a layer having an organic compound and an inorganic compound is provided between a pair of electrodes. By adopting the organic memory as the memory circuit 206 of the RFID tag, reduction in size, thickness, and weight of the RFID tag can be achieved.

The present invention disclosed in this specification can be applied to a circuit included in the RFID tag 200.

FIGS. 7A to 7D show examples of uses of the RFID tag. By mounting the RFID tag as described in this embodiment on a product such as a recording medium 301 on which music or a movie is recorded, a case in which the recording medium 301 is housed, a book 302, a product package 303, or clothing 304, management of sales, stock, checkout, or the like, prevention of loss or theft, or the like of the product on which the RFID tag is mounted can be achieved. In each of FIG. 7A to 7D, an example of position 300 of the RFID tag is shown.

By applying the present invention disclosed in this specification to the RFID tag, the RFID tag can be supplied at low cost. Therefore, the present invention disclosed in this specification can contribute to widespread use of RFID tags.

This embodiment can be freely combined with Embodiment Modes 1 to 3 and Embodiments 1 to 3.

This application is based on Japanese Patent Application serial no. 2005-160730 filed in Japan Patent Office on May 31, 2005, the entire contents of which are hereby incorporated by reference.

What is claimed is:

1. A method for manufacturing a semiconductor device comprising:
    forming a metal film over a substrate;
    forming a solution containing a metal alkoxide over the metal film;
    baking the solution to form a metal oxide layer under a reduced pressure;
    forming a transistor over the metal oxide layer;
    forming an insulating layer over the transistor;
    forming an opening to expose at least a part of the metal oxide layer; and
    peeling off the transistor from the substrate.

2. A method for manufacturing a semiconductor device according to claim 1, wherein the metal oxide film is formed by a coating drying method.

3. A method for manufacturing a semiconductor device according to claim 1, wherein the metal oxide film is formed by a sol-gel method.

4. A method for manufacturing a semiconductor device according to claim 1, wherein the metal oxide film is formed by a liquid-phase deposition method.

5. A method for manufacturing a semiconductor device according to claim 1, wherein the metal oxide film is formed by oxidizing the metal film.

6. A method for manufacturing a semiconductor device according to claim 1, wherein the metal film contains at least one selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir).

7. A method for manufacturing a semiconductor device according to claim 1, wherein the metal oxide film contains at least one selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir).

8. A method for manufacturing a semiconductor device according to claim 1, wherein the metal oxide film has a thickness of 1 nm to 50 nm.

9. A method for manufacturing a semiconductor device according to claim 1, wherein the opening is formed by a laser irradiation.

10. A method for manufacturing a semiconductor device according to claim 1, wherein the peeling step is conducted by a physical means.

11. A method for manufacturing a semiconductor device according to claim 1, wherein the semiconductor device is an RFID tag.

12. A method for manufacturing a semiconductor device comprising:
forming a metal film over a substrate;
forming a solution containing a metal alkoxide over the metal film;
baking the solution to form a metal oxide layer under a reduced pressure;
forming a transistor over the metal oxide layer;
forming an insulating layer over the transistor;
forming an opening to expose at least a part of the metal oxide layer;
removing a portion of the metal oxide layer by introducing an etchant in the opening; and
peeling off the transistor from the substrate.

13. A method for manufacturing a semiconductor device according to claim 12, wherein the etchant contains halogen fluoride.

14. A method for manufacturing a semiconductor device according to claim 12, wherein the metal oxide film is formed by a coating drying method.

15. A method for manufacturing a semiconductor device according to claim 12, wherein the metal oxide film is formed by a sol-gel method.

16. A method for manufacturing a semiconductor device according to claim 12, wherein the metal oxide film is formed by a liquid-phase deposition method.

17. A method for manufacturing a semiconductor device according to claim 12, wherein the metal oxide film is formed by oxidizing the metal film.

18. A method for manufacturing a semiconductor device according to claim 12, wherein the metal film contains at least one selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir).

19. A method for manufacturing a semiconductor device according to claim 12, wherein the metal oxide film contains at least one selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir).

20. A method for manufacturing a semiconductor device according to claim 12, wherein the metal oxide film has a thickness of 1 nm to 50 nm.

21. A method for manufacturing a semiconductor device according to claim 12, wherein the opening is formed by a laser irradiation.

22. A method for manufacturing a semiconductor device according to claim 12, wherein the peeling step is conducted by a physical means.

23. A method for manufacturing a semiconductor device according to claim 12, wherein the semiconductor device is an RFID tag.

24. A method for manufacturing a semiconductor device comprising:
forming a metal film over a substrate;
forming a solution containing a metal alkoxide over the metal film;
baking the solution to form a metal oxide layer under a reduced pressure;
forming a thin film transistor over the metal oxide layer;
forming an antenna electrically connected to the thin film transistor;
forming an insulating layer over the thin film transistor and the antenna;
forming an opening to expose at least a part of the metal oxide layer; and
peeling off the thin film transistor from the substrate.

25. A method for manufacturing a semiconductor device according to claim 24, wherein the metal oxide film is formed by a coating drying method.

26. A method for manufacturing a semiconductor device according to claim 24, wherein the metal oxide film is formed by a sol-gel method.

27. A method for manufacturing a semiconductor device according to claim 24, wherein the metal oxide film is formed by a liquid-phase deposition method.

28. A method for manufacturing a semiconductor device according to claim 24, wherein the metal oxide film is formed by oxidizing the metal film.

29. A method for manufacturing a semiconductor device according to claim 24, wherein the metal film contains at least one selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir).

30. A method for manufacturing a semiconductor device according to claim 24, wherein the metal oxide film contains at least one selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir).

31. A method for manufacturing a semiconductor device according to claim 24, wherein the metal oxide film has a thickness of 1 nm to 50 nm.

32. A method for manufacturing a semiconductor device according to claim 24, wherein the opening is formed by a laser irradiation.

33. A method for manufacturing a semiconductor device according to claim 24, wherein the peeling step is conducted by a physical means.

34. A method for manufacturing a semiconductor device according to claim 24, wherein the semiconductor device is an RFID tag.

35. A method for manufacturing a semiconductor device comprising:
forming a metal film over a substrate;
forming a solution containing a metal alkoxide over the metal film;
baking the solution to form a metal oxide layer under a reduced pressure;
forming a thin film transistor over the metal oxide layer;
forming an antenna electrically connected to the thin film transistor;
forming an insulating layer over the thin film transistor and the antenna;
forming an opening to expose at least a part of the metal oxide layer;
removing a portion of the metal oxide layer by introducing an etchant in the opening; and
peeling off the thin film transistor from the substrate.

36. A method for manufacturing a semiconductor device according to claim 35, wherein the etchant contains halogen fluoride.

37. A method for manufacturing a semiconductor device according to claim 35, wherein the metal oxide film is formed by a coating drying method.

38. A method for manufacturing a semiconductor device according to claim 35, wherein the metal oxide film is formed by a sol-gel method.

39. A method for manufacturing a semiconductor device according to claim 35, wherein the metal oxide film is formed by a liquid-phase deposition method.

40. A method for manufacturing a semiconductor device according to claim 35, wherein the metal oxide film is formed by oxidizing the metal film.

41. A method for manufacturing a semiconductor device according to claim 35, wherein the metal film contains at least one selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir).

42. A method for manufacturing a semiconductor device according to claim 35, wherein the metal oxide film contains at least one selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir).

43. A method for manufacturing a semiconductor device according to claim 35, wherein the metal oxide film has a thickness of 1 nm to 50 nm.

44. A method for manufacturing a semiconductor device according to claim 35, wherein the opening is formed by a laser irradiation.

45. A method for manufacturing a semiconductor device according to claim 35, wherein the peeling step is conducted by a physical means.

46. A method for manufacturing a semiconductor device according to claim 35, wherein the semiconductor device is an RFID tag.

47. A method for manufacturing a semiconductor device according to claim 1, wherein a rotary pump is used at the baking step.

48. A method for manufacturing a semiconductor device according to claim 12, wherein a rotary pump is used at the baking step.

49. A method for manufacturing a semiconductor device according to claim 24, wherein a rotary pump is used at the baking step.

50. A method for manufacturing a semiconductor device according to claim 35, wherein a rotary pump is used at the baking step.

* * * * *